United States Patent
Oh et al.

(10) Patent No.: US 7,814,403 B2
(45) Date of Patent: Oct. 12, 2010

(54) METHOD OF ENCODING AND DECODING USING LOW DENSITY PARITY CHECK CODE

(75) Inventors: Min Seok Oh, Seoul (KR); Kyu Hyuk Chung, Seoul (KR)

(73) Assignee: LG Electronics Inc., Seoul (KR)

( * ) Notice: Subject to any disclaimer, the term of this patent is extended or adjusted under 35 U.S.C. 154(b) by 700 days.

(21) Appl. No.: 11/572,705

(22) PCT Filed: Jul. 26, 2005

(86) PCT No.: PCT/KR2005/002421

§ 371 (c)(1),
(2), (4) Date: Jul. 16, 2007

(87) PCT Pub. No.: WO2006/011744

PCT Pub. Date: Feb. 2, 2006

(65) Prior Publication Data

US 2008/0270877 A1    Oct. 30, 2008

(30) Foreign Application Priority Data

Jul. 27, 2004  (KR) .................... 10-2004-0058647
Aug. 2, 2004   (KR) .................... 10-2004-0060839
Aug. 6, 2004   (KR) .................... 10-2004-0062068

(51) Int. Cl.
*G06F 11/00* (2006.01)
(52) U.S. Cl. .................................................. 714/800
(58) Field of Classification Search ................ 714/746, 714/752, 800–801, 804
See application file for complete search history.

(56) References Cited

U.S. PATENT DOCUMENTS

| 4,775,979 | A  |   | 10/1988 | Oka |
| 7,000,168 | B2 | * | 2/2006  | Kurtas et al. ................ 714/755 |
| 7,165,205 | B2 | * | 1/2007  | Blankenship et al. ....... 714/752 |

FOREIGN PATENT DOCUMENTS

EP       1 385 270 A3    1/2004
WO   WO 2004-047019 A2   6/2004

OTHER PUBLICATIONS

Thong Zang et al.: "A class of effcient-encoding generalized low-density parity-check codes." Department of Electrical and Computer Engineering University of Minnesota; in 2001 IEEE pp. 2477 to 2480.

Gallager, R. "Low density parity-check codes." IRE Transactions on Information Theory. Jan. 1962.

Xuedong, W., et al.; "Study on Encode Construction of Low Density Parity Check (LDPC)"; Journal of Communications Technology; pp. 36-40; No. 9; Oct. 30, 2003.

* cited by examiner

*Primary Examiner*—Shelly A Chase
(74) *Attorney, Agent, or Firm*—Lee, Hong, Degerman, Kang & Waimey (57) ABSTRACT

A method of encoding and decoding using an LDPC code is disclosed, by which a memory for storing a parity check matrix necessary for the encoding or decoding using the LDPC code and calculation amount and complexity necessary for the encoding or decoding can be reduced. The present invention includes a step of encoding an input data using a parity check matrix H having a configuration of $H=[H_d|H_p]$ ($H_d$ is $(n-k) \times k$ dimensional, $H_p$ is $(n-k) \times (n-k)$ dimensional, k is a bit number of the input data, and n is a bit number of a codeword), wherein if the $H_d$ comprises a plurality of sub-matrices, each of the sub-matrices has predetermined regularity in a row or column weight.

20 Claims, 10 Drawing Sheets

$$H = \begin{pmatrix} x & x & x & x & & x & x & x & x \\ x & x & x & x & & x & x & x & x \\ x & x & x & x & & x & x & x & x \\ x & x & x & x & & x & x & x & x \end{pmatrix}$$

$$\underbrace{\phantom{xxxxxxxx}}_{H_d} \quad \underbrace{\phantom{xxxxxxxx}}_{H_p}$$

| (1,1) Sub-matrix | (1,2) Sub-matrix | (1,3) Sub-matrix | (1,4) Sub-matrix |
|---|---|---|---|
| (2,1) Sub-matrix | (2,2) Sub-matrix | (2,3) Sub-matrix | (2,4) Sub-matrix |
| (3,1) Sub-matrix | (3,2) Sub-matrix | (3,3) Sub-matrix | (3,4) Sub-matrix |
| (4,1) Sub-matrix | (4,2) Sub-matrix | (4,3) Sub-matrix | (4,4) Sub-matrix |

METHOD OF ENCODING AND DECODING USING LOW DENSITY PARITY CHECK CODE

CROSS-REFERENCE TO RELATED APPLICATIONS

Pursuant to 35 U.S.C. §119(a), this application claims the benefit of earlier filing date and right of priority to Korean Application Nos. 10-2004-0058647, filed Jul. 27, 2004, 10-2004-0060839, filed Aug. 2, 2004 and 10-2004-0062068, filed Aug. 6, 2004, as well as PCT/KR2005/002421, filed Jul. 26, 2005, the contents of all of which are incorporated by reference herein in their entirety.

TECHNICAL FIELD

The present invention relates to a method of encoding and decoding, and more particularly, to a method of encoding and decoding using a low density parity check (hereinafter abbreviated LDPC) code. Although the present invention is suitable for a wide scope of applications, it is particularly suitable for having enhanced performance.

BACKGROUND ART

Generally, encoding is a process that a transmitting side performs a data processing for a receiving side to restore original data despite errors caused by signal distortion, signal loss and the like while the transmitting side transmits data via a communication channel. And, decoding is a process that the receiving side restores the encoded transmitted data into the original data.

Recently, many attentions are paid to an encoding method using an LPDC code. The LDPC code is a linear block code having low density since most of elements of a parity check matrix H are zeros, which was proposed by Gallager in 1962. It was difficult to implement the LDPC code that is very complicated due to the technological difficulty in those days. Yet, the LDPC code was taken into reconsideration in 1995 so that its superior performance has been verified. So, many efforts are made to research and develop the LPDC code. (Reference: [1] Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999))

A parity check matrix of the LDPC code is a binary matrix including '0' and '1'. Since the number of '1' of the parity check matrix of the LDPC code is very small, decoding of the parity check matrix of the LDPC is enabled through repetition decoding in case of a large matrix size. If the matrix size is very large, the parity check matrix of the LDPC code shows performance approximating a channel capacity limit of Shannon like a turbo code.

The LDPC code can be explained by a parity check matrix H of (n−k)×n dimensions. And, a generator matrix G corresponding to the parity check matrix H can be found by Equation 1.

$$H \cdot G = 0 \qquad \text{[Equation 1]}$$

In an encoding/decoding method using an LDPC code, a transmitting side encodes input data by Equation 2 using the generator matrix G having a relation of Equation 1 with the parity check matrix H.

$$c = G \cdot u, \qquad \text{[Equation 2]}$$

where 'c' is a codeword and 'u' is a data frame.

Yet, an input data encoding method using the parity check matrix H instead of using the generator matrix G is generally used nowadays. Hence, as explained in the above explanation, the parity check matrix H is the most important factor in the encoding/decoding method using the LDPC code. Since the parity check matrix H has a huge size, many operations are required for the corresponding encoding and decoding processes. And, implementation of the parity check matrix H is very complicated. Moreover, the parity check matrix H needs a large storage space.

In adding many weights to the parity check matrix H of the binary matrix including '0' and '1' (i.e., increasing the number of '1'), more variables are added to parity check equations. Hence, better performance can be shown in the encoding and decoding method using the LDPC code.

However, if more weights are added to the parity check matrix H, 4-cycle or 6-cycle can be generated from the entire parity check matrix. Hence, the performance of the encoding and decoding method using the LDPC code may be degraded.

DISCLOSURE OF THE INVENTION

Accordingly, the present invention is directed to a method of encoding and decoding method using a low density parity check (LDPC) code that substantially obviates one or more of the problems due to limitations and disadvantages of the related art.

An object of the present invention is to provide a method of encoding and decoding using an LDPC code, by which a memory for storing a parity check matrix necessary for the encoding or decoding using the LDPC code and calculation amount and complexity necessary for the encoding or decoding can be reduced.

Another object of the present invention is to provide a method of encoding and decoding using an LDPC code, by which performance in the encoding or decoding is enhanced in a manner of minimizing 4- or 6-cycle of a parity check matrix H.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method of encoding using an LDPC (low density parity check) code according to the present invention includes a step of encoding an input data using a parity check matrix H having a configuration of H=[$H_d|H_p$] ($H_d$ is (n−k)×k dimensional, $H_p$ is (n−k)×(n−k) dimensional, k is a bit number of the input data, and n is a bit number of a codeword), wherein if the $H_d$ comprises a plurality of sub-matrices, each of the sub-matrices has predetermined regularity in a row or column weight.

Preferably, if the $H_d$ comprises m sub-matrices having (n−k)/m×k dimensions, a $j^{th}$ row of a specific sub-matrix of the m sub-matrices has $W_j$ consecutive 1's on a condition that the column weight of entire columns of the specific sub-matrix is 1. More preferably, the $W_j$ is identical to entire rows of the specific sub-matrix. More preferably, the $W_j$ irregularly increases or decreases for the entire rows of the specific sub-matrix.

Preferably, if the $H_d$ comprises m sub-matrices having (n−k)/m×k dimensions, the row or column weight of a random sub-matrix configuring the $H_d$ is 1.

Preferably, any two random rows of the entire $H_d$ do not have 1 on at least two columns simultaneously. More preferably, a case that all combination-enabling two rows selected from three random rows of the entire $H_d$ have 1 at a same point is equal to or smaller than a preset critical value ($C_{max}$).

Preferably, any two random rows of the entire parity check matrix H do not have 1 on at least two rows simultaneously. More preferably, a case that all combination-enabling two rows selected from three random rows of the parity check matrix H have 1 at a same point is equal to or smaller than a preset critical value ($C_{max}$).

More preferably, the critical value ($C_{max}$) is an arbitrary value within a range of 10~100.

More preferably, the $H_p$ is a dual diagonal matrix.

To further achieve these and other advantages and in accordance with the purpose of the present invention, in decoding an input data using a parity check matrix H, a method of decoding using an LDPC code is characterized in that the parity check matrix has a configuration of H=[$H_d$|$H_p$] ($H_d$ is (n−k)×k dimensional, $H_p$ is (n−k)×(n−k) dimensional, k is a bit number of the input data, and n is a bit number of a codeword), wherein if the $H_d$ includes a plurality of sub-matrices, each of the sub-matrices has predetermined regularity in a row or column weight.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

BEST MODE FOR CARRYING OUT THE INVENTION

Reference will now be made in detail to a method of encoding and decoding using an LDPC (low density parity check) code according to the preferred embodiments of the present invention, examples of which are illustrated in the accompanying drawings.

Figure 1:
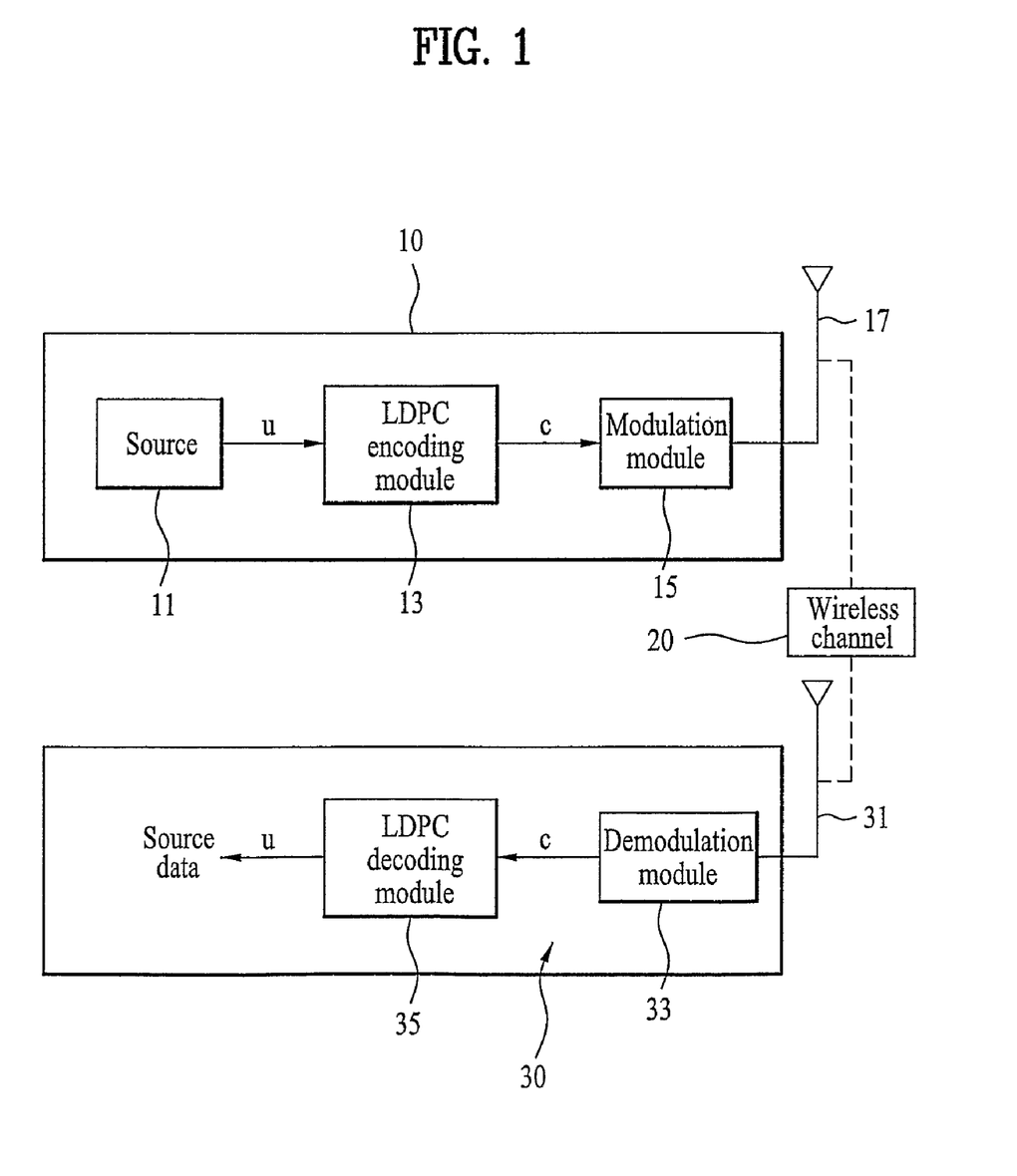
FIG. 1 is a block diagram of a communication system to explain one preferred embodiment of the present invention.

FIG. 1 is a block diagram of a communication system to explain one preferred embodiment of the present invention, in which a technical feature of the present invention is applied to a wireless communication system for example.

Referring to FIG. 1, a transmitter 10 and a receiver 30 communicate with each other using a wireless channel 20 as a medium. In the transmitter 10, a k-bit source data u outputted from a data source 11 is converted to an n-bit codeword c by LDPC encoding in an LDPC encoding module 13. The codeword c is wireless-modulated by a modulation module 15, is transmitted via an antenna 17, and is then received by another antenna 31 of the receiver 30. In the receiver 30, original data is restored through a process reverse to that of the transmitter 10. Namely, the source data u can be finally obtained by demodulation of a demodulation module 33 and decoding of an LDPC decoding module 35.

The above explained data transmitting/receiving process is described within a minimum range required for explaining the features of the present invention. So, it is apparent to those skilled in the art that the corresponding process needs more procedures for the data transmission/reception.

Figure 2:
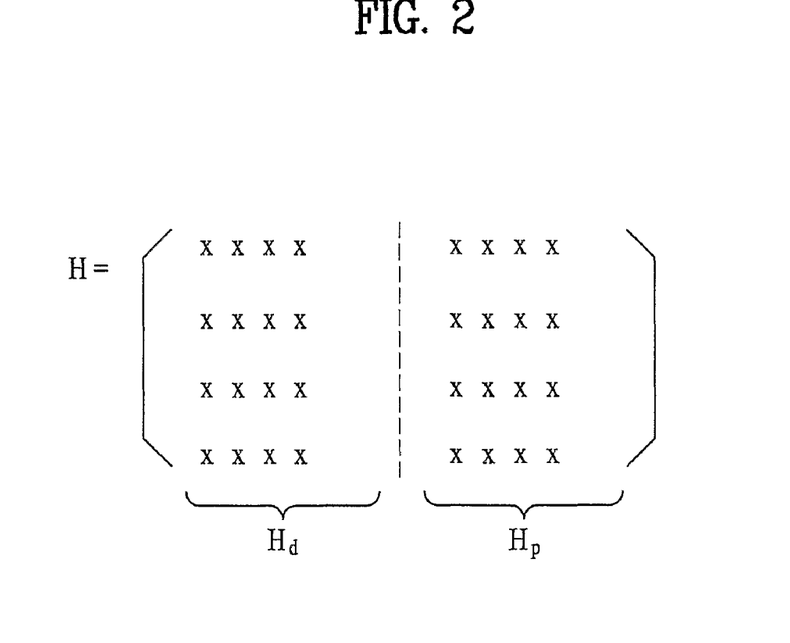
FIG. 2 is an exemplary diagram for explaining a relation of H=[$H_d$|$H_p$]

In Equation 1, a first parity check matrix H can be expressed by H=[$H_d$|$H_p$] ($H_d$ is (n−k)×k dimensional, $H_p$ is (n−k)×(n−k) dimensional). FIG. 2 is an exemplary diagram for explaining a relation of H=[$H_d$|$H_p$]. The 'k' is a length (bit unit) of source data inputted to the LDPC encoding module 13 and the 'n' means a length (bit unit) of the encoded codeword c.

By Equation 1 and the relation of H=[$H_d$|$H_p$], it can be known that $G=[I|(H_p^{-1}H_d)^t]^t$. Hence, the LDPC encoding module 13 performs encoding in a manner of multiplying the input data u by '$G=[I|(H_p^{-1}H_d)^t]^t$' by Equation 2. Hence, Equation 2 can be replaced by Equation 4. In particular, a k-bit input source data $s_{1 \times k}$ is encoded into an n-bit codeword $x_{1 \times k}$ by Equation 2. A codeword x has a configuration of x=[s p]=[$s_0, s_1, \ldots, s_{k-1}, p_0, p_1, \ldots, p_{m-1}$], where ($p_0, p_1, \ldots, p_{m-1}$) are parity check bits and ($s_0, s_1, \ldots, s_{k-1}$) are systematic bits.

$$c = [I|(H_p^{-1}H_d)^t]^t \cdot u \qquad \text{[Equation 4]}$$

Yet, the encoding scheme using the generator matrix G is very complicated. To reduce such a complexity, it is preferable that the input source data is directly encoded using the parity check matrix H. Namely, since x=[s p], H·x=H·[s p]=0 if using a characteristic of H·x=0. From the Equation, a parity check bit p can be obtained to finally find the code word x=[s p].

Figure 3:
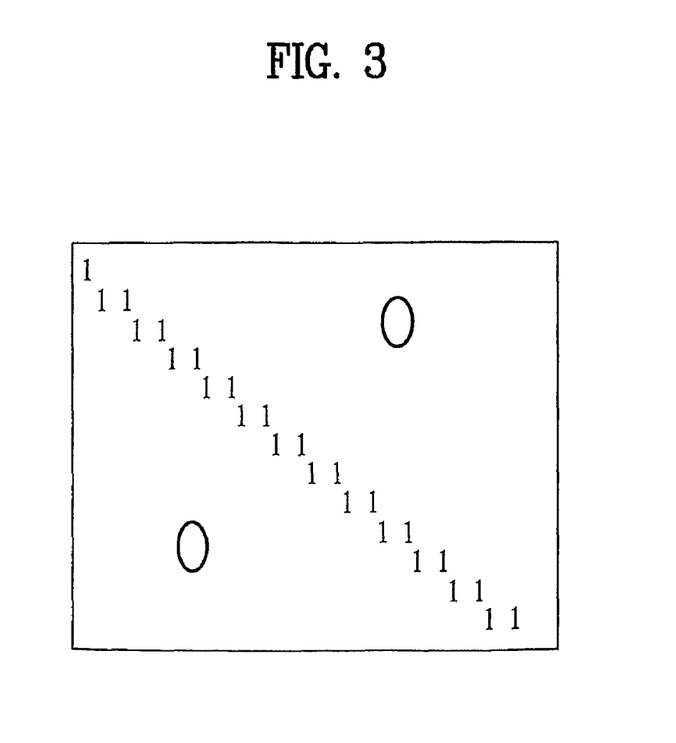
FIG. 3 is an exemplary diagram of a dual diagonal matrix.

Preferably, a dual diagonal matrix of (n−k)×(n−k) dimensions is used as the $H_p$. The dual diagonal matrix means a matrix in which a main diagonal and a diagonal directly below the main diagonal are '1' and in which the rest are zero. And, FIG. 3 shows an exemplary diagram to help the dual diagonal matrix to be understood.

In case of dividing the $H_d$ into a plurality of sub-matrices, each of the sub-matrices is preferably set to have a predetermined regularity in row weight and in column weight. Namely, if each of the sub-matrices is set to have the regularity in row and column weights, it is able to save a storage space for storing the $H_d$ or the parity check matrix H and to reduce operational amount or complexity in the process of encoding or decoding. Embodiments of the $H_d$ having the predetermined regularity in the row and column weights are explained as follows.

In a first embodiment, in case of dividing the $H_d$ into m sub-matrices of (n−k)/m×k dimensions, a $j^{th}$ row of one specific sub-matrix of the m sub-matrices the $H_d$ having consecutive '1' amounting to the number of $W_j$ (j=1, 2, . . . , (n−k)/m) on condition that each column weight of the specific sub-matrix is '1'. The $W_j$ can be identical to the entire rows of the specific sub-matrix. And, the $W_j$ can irregularly increase or decrease for the entire rows of the specific sub-matrix.

Figure 4:
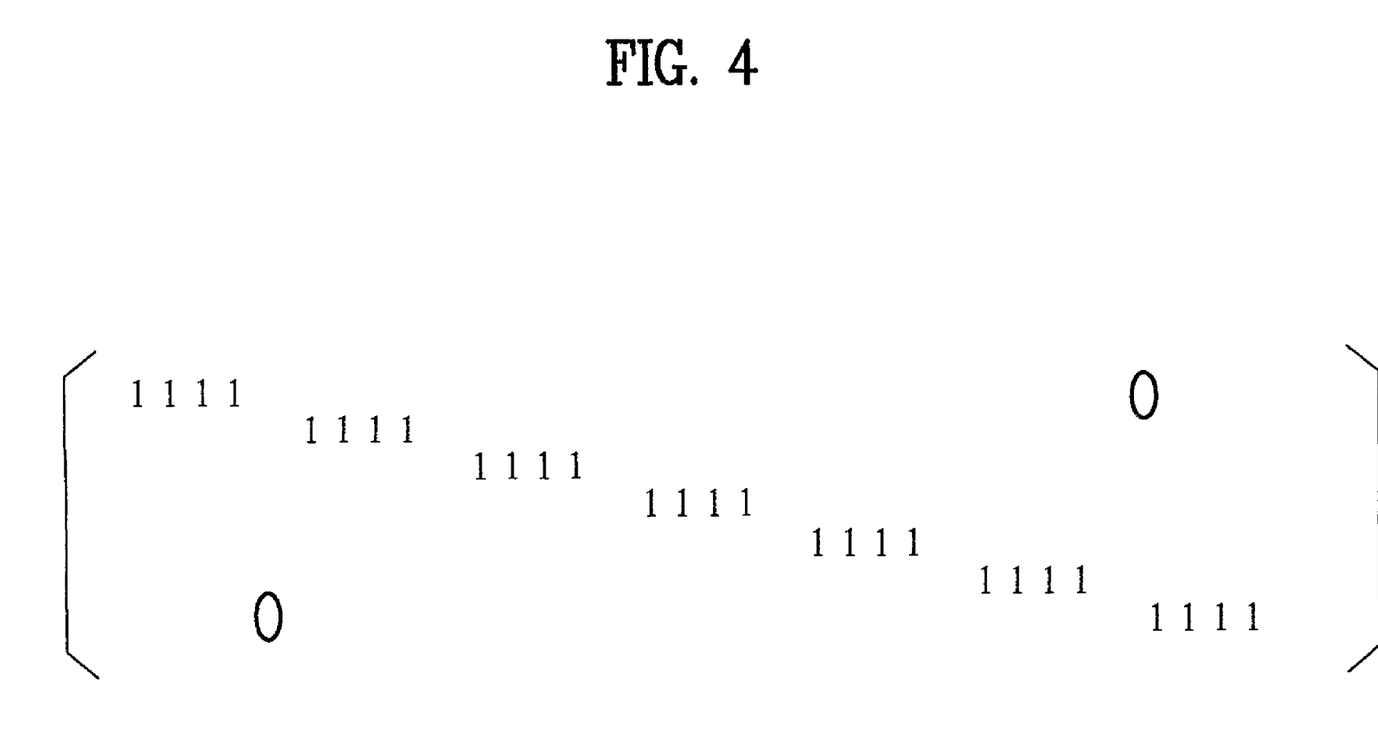
FIG. 4 is a diagram of a specific sub-matrix of $H_d$ according to one preferred embodiment of the present invention.
Figure 5:
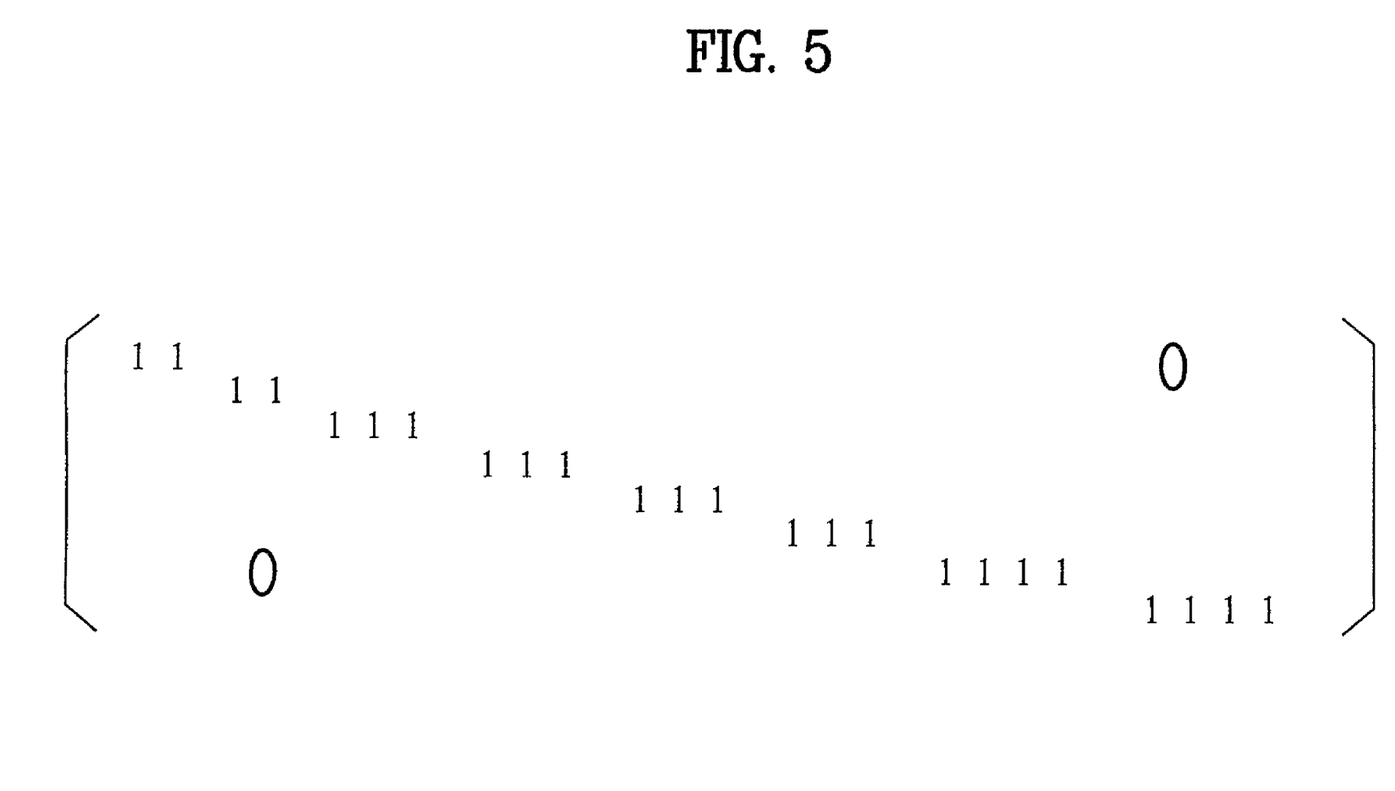
FIG. 5 is a diagram of a specific sub-matrix of $H_d$ according to another preferred embodiment of the present invention.

FIG. 4 and FIG. 5 are diagrams to explain the first embodiment in detail and show examples of the specific sub-matrix included in the $H_d$.

The specific sub-matrix shown in FIG. 4 is a matrix having 7×28 dimensions. Yet, a substantial matrix used for LDPC encoding is much larger than the matrix of the 7×28 dimensions. In FIG. 4, each row of the specific sub-matrix has four consecutive '1' and the rest values of the corresponding row are zero (i.e., a weight of each row is 4.) And, a weight of each column of the specific sub-matrix is 1. FIG. 5 shows an example that each row of the specific sub-matrix has $W_j$ consecutive '1' and the rest values of the corresponding row are zero. Yet, the $W_j$ is irregularly changed for each row. In this case, a weight of each column of the specific sub-matrix is 1 as well.

In a second embodiment of the $H_d$ having a predetermined regularity in row and column weights, the $H_d$ includes r(1−r) matrices $H^{(i)}_d$ [where r=k/n and i=1, 2, . . . , r/(1−r)] having (n−k)×(n−k) dimensions, a random $H^{(i)}_d$ includes m×m sub-matrices each of which has (n−k)/m×(n−k)/m dimensions, and a row or column weight of the random sub-matrix configuring the $H_d$ is 1.

The $H_d$ can includes at least one $H^{(i)}_d$ [where i=1, 2, . . . , r/(1−r)] according to a code rate (r=k/n). The code rate r is a ratio of a source data length k to a length n of the encoded data and r=1/2, 2/3, 3/4, 4/5 and the like is used in general. The $H^{(i)}_d$ is a matrix having (n−k)×(n−k) dimensions and has a relation of $H_d = [H^{(1)}_d | H^{(2)}_d | \ldots | H^{(r/(1-r))}_d]$.

Each $H^{(i)}_d$ is characterized in that a row or column weight of a random sub-matrix configuring the $H_d$ is 1 in case of being divided by m×m sub-matrices each of which has (n−k)/m×(n−k)/m dimensions. The 'm' is a positive integer and corresponds to a resolution factor of the $H_d$. Preferably, the 'm' is selected from 4~12 to provide best performance.

Figure 6:
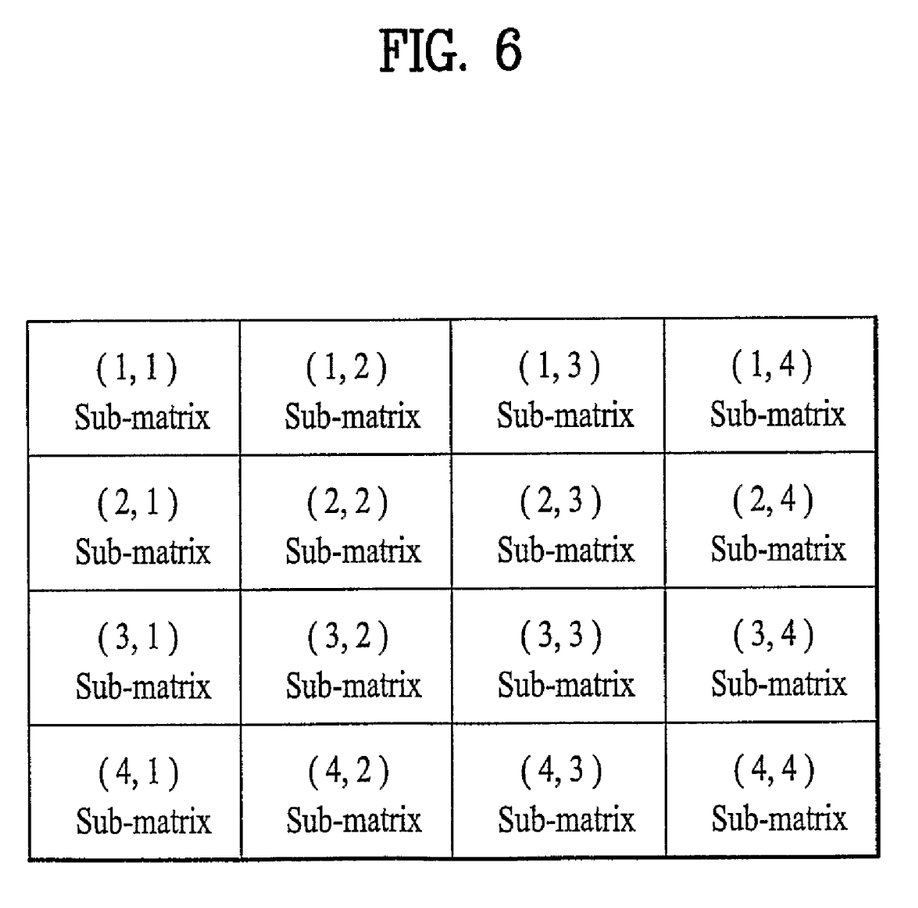
FIG. 6 is an exemplary diagram of $H^{(i)}_d$ in case of m=4 to explain a feature of the present invention.

FIG. 6 shows an example of $H^{(i)}_d$ in case of m=4, on which the $H^{(i)}_d$ includes sixteen sub-matrices of (1, 1), (1, 2), . . . , (4, 4). A fact that a row or column weight of each of the sub-matrices is 1 means that '1' exists on a random row or column of each of the sub-matrices and that the rest values of the random row or column are zeros, respectively.

If the parity check matrix H is configured with a plurality of sub-matrices having (n−k)/m×(n−k)/m dimensions by extending the above-explained features, it will be possible that a row or column weight of a random one of the sub-matrices is set to 1. Namely, $H_d$ as an element of the parity check matrix H can be set just to have regularity that the row or column weight of the sub-matrix configuring the $H_d$ is 1 or the parity check matrix H can be set entirely to have regularity that the weight or column weight of each of the sub-matrices configuring the entire parity check matrix H is 1.

In the encoding or decoding method using the LDPC code, the $H_d$ or the parity check matrix H is preferably provided with the following two features. Namely, the encoding or decoding method using the LDPC code is carried out in a manner of repetitive exchange of probability information decide according to a channel status between rows configuring the $H_d$ or the parity check matrix H. Yet, the probability information of each row is once transferred to another rows and then returns without sufficient repetitions in the parity check matrix H failing to be provided with the following two features. Hence, good performance is not expected.

Preferably, any random two rows of the $H_d$ or the parity check matrix H are set not to have '1' simultaneously on at least two points overall. The fact that any random two rows of the $H_d$ are set not to have '1' simultaneously on at least two points overall means that there exists only one point having '1' exist thereon in comparing two random rows in the entire $H_d$ to be overlapped with another point having '1' exist thereon.

Figure 7:
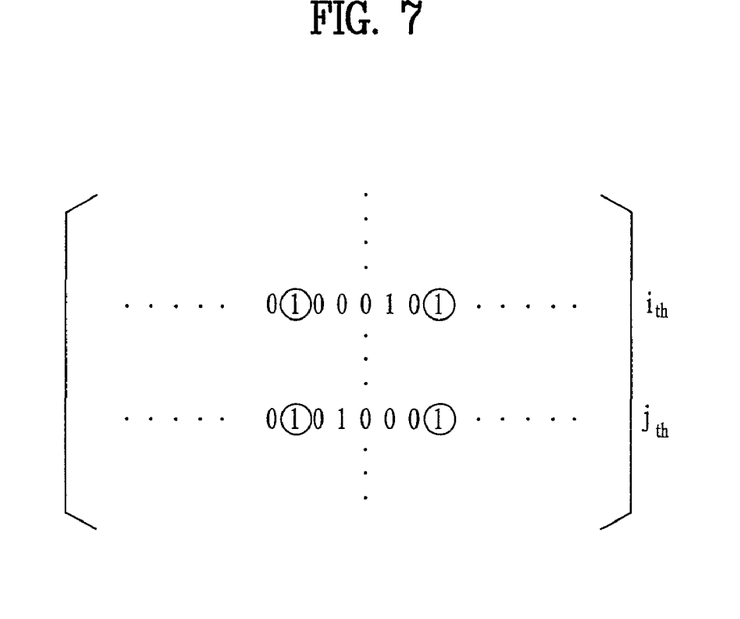
FIG. 7 is an exemplary diagram for explaining one feature of the present invention, in which two rows of a parity check matrix H simultaneously have '1' at two points.

FIG. 7 shows an exemplary case that two rows of the parity check matrix H have '1' at two points simultaneously.

Referring to FIG. 7, two points indicated by two closed circles of an $i^{th}$ row and two points indicated by two closed circles of a $j^{th}$ row are set to '1'. the $H_d$ or the parity check matrix H should avoid the case shown in FIG. 7 to enable the encoding or decoding method using the LDPC code to provide good performance. A case that two points of two rows of the $H_d$ or the parity check matrix H have '1' simultaneously is called 4-cycle. Hence, the fact that any two random rows of the $H_d$ or the parity check matrix H do not have '1' on at least two points means that the 4-cycle is not formed through the $H_d$ or the parity check matrix H overall.

Figure 8:
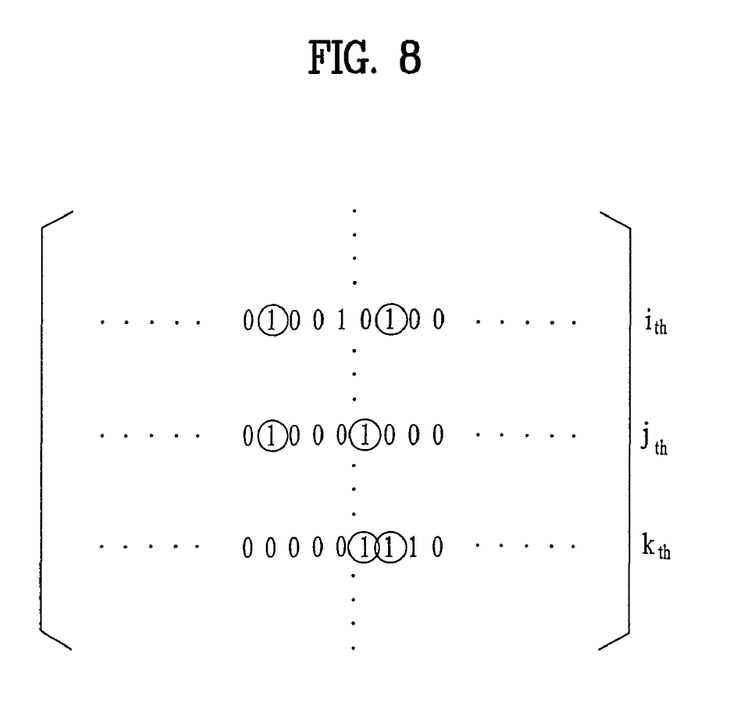
FIG. 8 is an exemplary diagram for explaining another feature of the present invention, in which all combination-enabling two rows selected from three random rows of a parity check matrix H have '1' at the same points, respectively.
Figure 9:
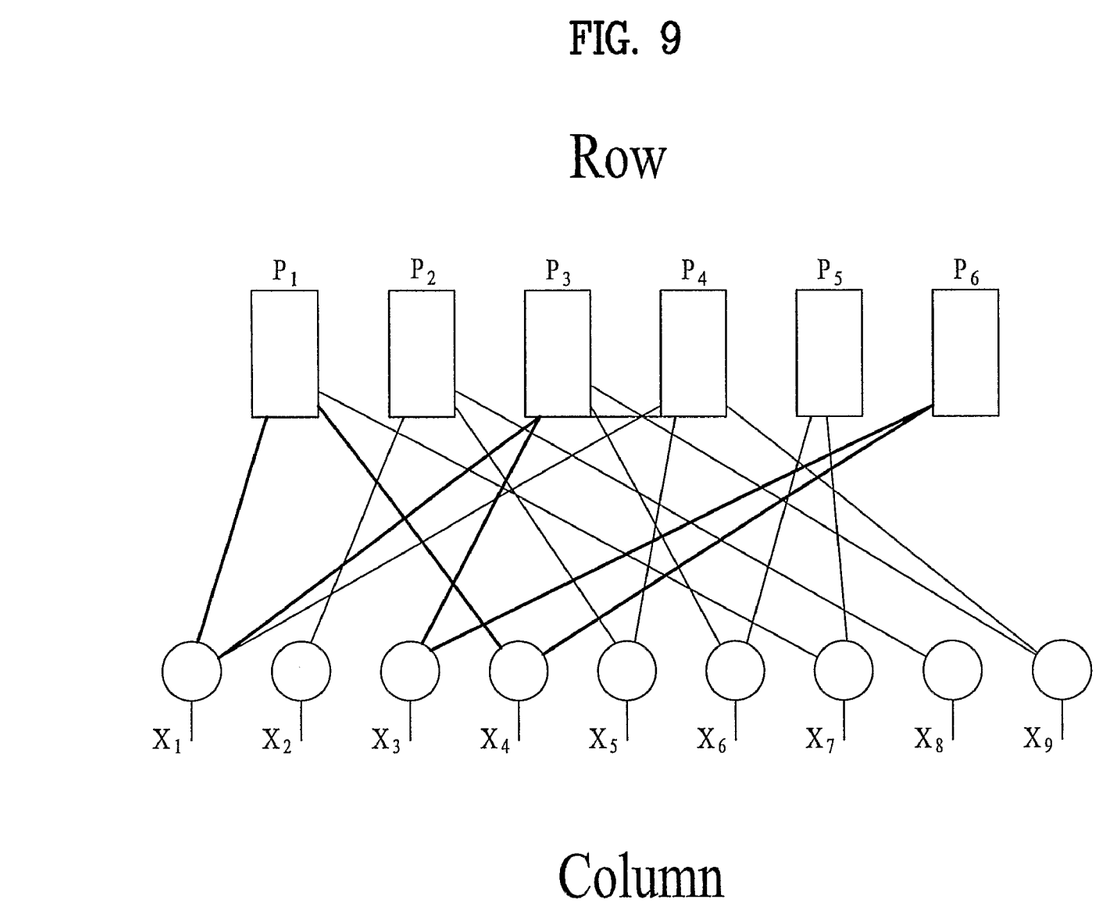
FIG. 9 is a bipartite graph as a different expression of a parity check matrix H.

FIG. 8 shows an exemplary case that all combination-enabling two rows selected from three random rows of the parity check matrix H have '1' at the same points, respectively. In other words, all combination-enabling two rows selected from $i^{th}$, $j^{th}$ and $k^{th}$ rows, i.e., $i^{th}$ and $j^{th}$ rows, $j^{th}$ and $k^{th}$ rows, or $k^{th}$ and $i^{th}$ rows have '1' at the same points. In FIG. 8, if close-circled six points of are connected, a cycle is formed. And, this cycle is called a 6-cycle. FIG. 9 is a bipartite graph as a different expression of a parity check matrix H, which means a 6-row 9-column parity check matrix. Parts indicated by bold lines in FIG. 9 configure the 6-cycle. Hence, a case that all combination-enabling two rows selected from three random rows of the parity check matrix H have '1' at the same points is equal to or smaller than a critical value $C_{max}$, which means that the parts configuring the 6-cycle for the entire parity check matrix H are equal to or smaller than the critical value $C_{max}$.

Preferably, the case that all combination-enabling two rows selected from three random rows of the $H_d$ or the parity check matrix H have '1' at the same points, respectively is equal to or smaller than a preset critical value $C_{max}$. Even if the 6-cycle exists in the $H_d$ or the parity check matrix H, it is preferable that the critical value $C_{max}$ is determined within a range that can avoid performance degradation of the encoding and decoding using the parity check matrix H. More preferably, the critical value $C_{max}$ is determined within a reasonable range by measuring and comparing the performance enhancement effect due to the reduction of the 6-cycle existing in the parity check matrix H and the calculation loads necessary for reducing the 6-cycle together. As a result of simulation, satisfactory performance can be obtained within a range of the critical value $C_{max}$ between 10~500. And, better performance is expected with a range of 10~100. Yet, the critical value $C_{max}$ is not limited to the above range.

Figure 10:
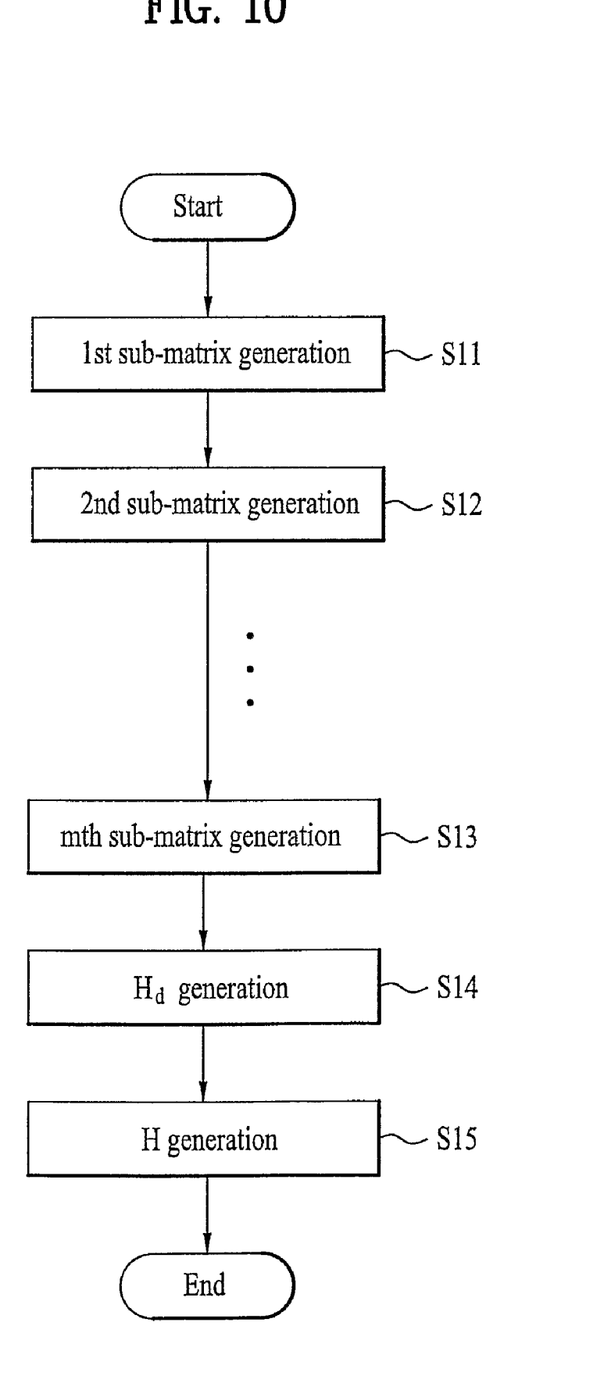
FIG. 10 is a flowchart of one process of generating a parity check matrix H according to the present invention.

FIG. 10 is a flowchart of one process of generating a parity check matrix H according to the first embodiment (FIG. 4 and FIG. 5) of the $H_d$ having the predetermined regularity in the row and column weights. The method described in the following is just exemplary and a parity check matrix H having the aforesaid features can be generated in various ways.

First of all, for a specific sub-matrix (first sub-matrix) having (n–k)/m×k dimensions of the $H_d$, a $j^{th}$ row of the specific sub-matrix is configured to have $W_j$(j=1, 2, ..., (n–k)/m) consecutive '1' on the condition that a column weight of all columns of the specific sub-matrix is 1 (S11).

Subsequently, column permutation is carried out on a different sub-matrix (second sub-matrix) among the rest sub-matrices of the $H_d$ so that any random two rows do not have '1' on at least two points simultaneously (S12). And, the step S12 is sequentially applied to the rest sub-matrices to configure the entire sub-matrices to a last sub-matrix ($m^{th}$ sub-matrix) (S13). The sub-matrices are combined to generate the $H_d$ (S14). And, $H_d$ and $H_p$ are combined to generate H (S15).

Figure 11:
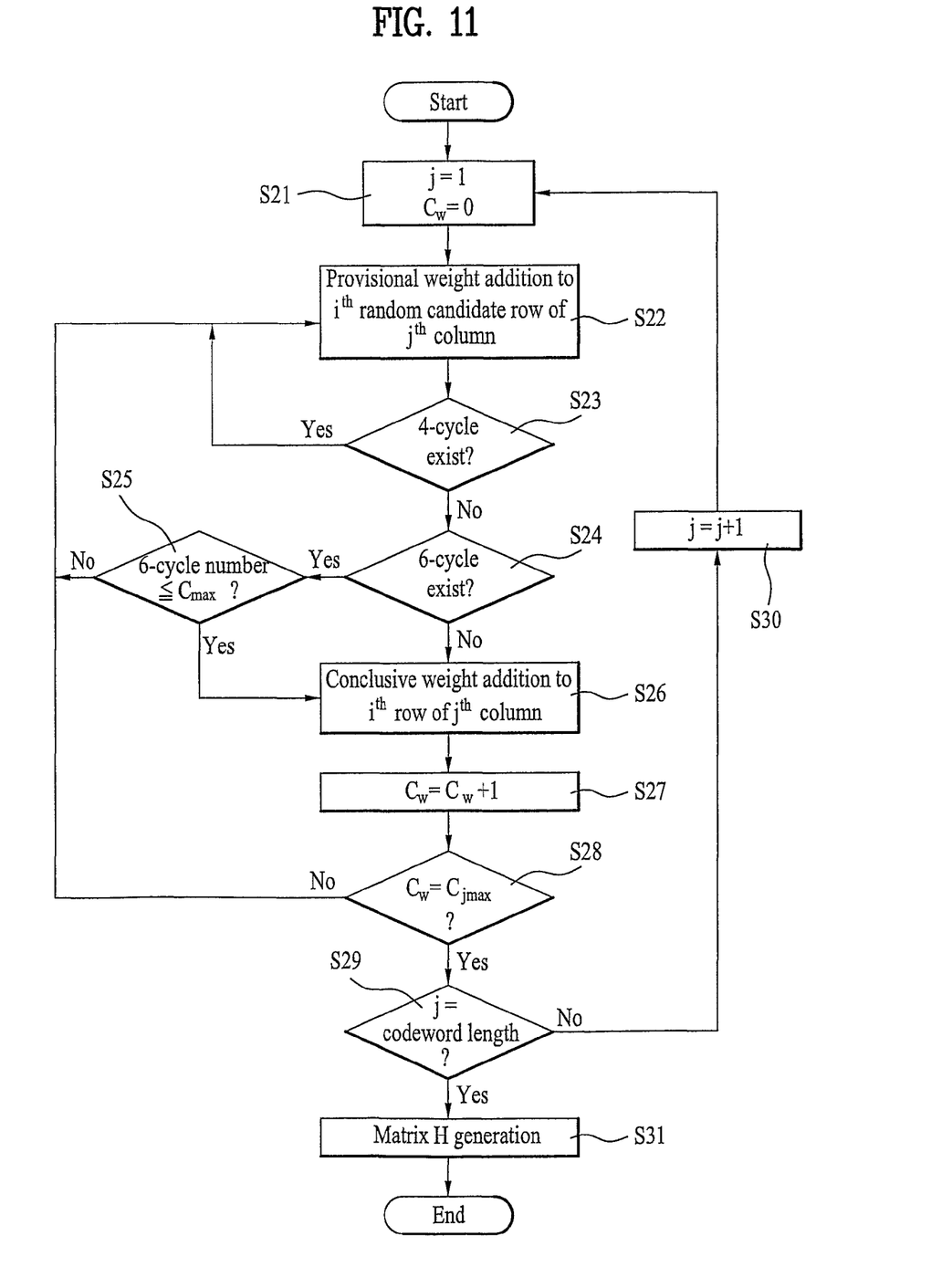
FIG. 11 is a flowchart of another process of generating a parity check matrix H according to the present invention.

FIG. 11 is a flowchart for explaining a process of generating a parity check matrix H having not a 4-cycle but a 6-cycle equal to or smaller than $C_{max}$. The method explained in the following is just exemplary and the parity check matrix H having the aforesaid features can be generated in various ways.

Referring to FIG. 11, to generate the parity check matrix H by determining a position of an element having a weight on a (n–k)×k parity check matrix H, 'i' is an index of an arbitrary row of the parity check matrix H, 'j' is an index of an arbitrary column of the parity check matrix X, and $C_w$ indicates a current weight number of the arbitrary column j.

First of all, a weight starts being added to a first column (j=1) having no weight ($C_w$=0) (S21). In this case, the weight addition means that an element corresponding to an arbitrary row of an arbitrary column is set to '1'.

A weight is provisionally added to an arbitrary $i^{th}$ candidate row of the first column (S22). The provisional weight addition means that the weight addition to the corresponding row is not final but can be changed by a next procedure. Subsequently, it is decided whether a 4-cycle exists in the entire parity check matrix H (S23). If the 4-cycle exists, a weight is added not to the $i^{th}$ row but to another row (S22) and a next procedure is then executed. If the 4-cycle does not exist, it is decided whether a 6-cycle exists in the entire parity check matrix H (S24).

As a result of deciding whether the 6-cycle exists in the entire parity check matrix H, if the 6-cycle does not exist, a weight is finally added to the $i^{th}$ row. If the 6-cycle exists, it is decided whether the 6-cycle number of the entire parity check matrix H exceeds a preset critical value $C_{max}$ (S25). If the 6-cycle number of the entire parity check matrix H does not exceed the preset critical value $C_{max}$, a weight is finally added to the $i^{th}$ row. If the 6-cycle number of the entire parity check matrix H exceeds the preset critical value $C_{max}$, a weight is added not to the $i^{th}$ row but to another row (S22) and a next procedure is then executed.

Once the weight is finally added to the $i^{th}$ row (S26), a current weight number $C_w$ of the $j^{th}$ column is incremented by 1 (S27). It is then decided whether the current weight number $C_w$ of the $j^{th}$ column is equal to a maximum weight number $C_{jmax}$ allowable to the $j_{th}$ column (S28). If the current weight number $C_w$ of the $j_{th}$ column is equal to the maximum weight number $C_{jmax}$ allowable to the $j_{th}$ column, weight addition to the $j^{th}$ column is terminated. And it is decided whether the j is equal to a codeword length (S29). If the current weight number $C_w$ of the $j^{th}$ column is not equal to the maximum weight number $C_{jmax}$ allowable to the $j_{th}$ column, it goes back to the step S22 to provisionally add a weight to a different row of the $j^{th}$ column and to continue executing the corresponding subsequent steps.

If the j is equal to the codeword length, the weight addition to the entire parity check matrix H is terminated. Hence, according to the corresponding weight addition result, the parity check matrix H can be finally generated (S31).

If the j is not equal to the codeword length, it means that there still exists a column to which a weight is not added yet. Hence, by adding 1 to the j (S30), a weight is added to a next column from the step S22 in the above-explained manner.

As mentioned in the foregoing description, the entire parity check matrix H can be generated in the above-explained manner. Alternatively, in the parity check matrix H having the configuration of [$H_d|H_p$], the $H_d$ is generated according to the above-explained steps and $H_p$ having a fixed form can be used.

Figure 12:
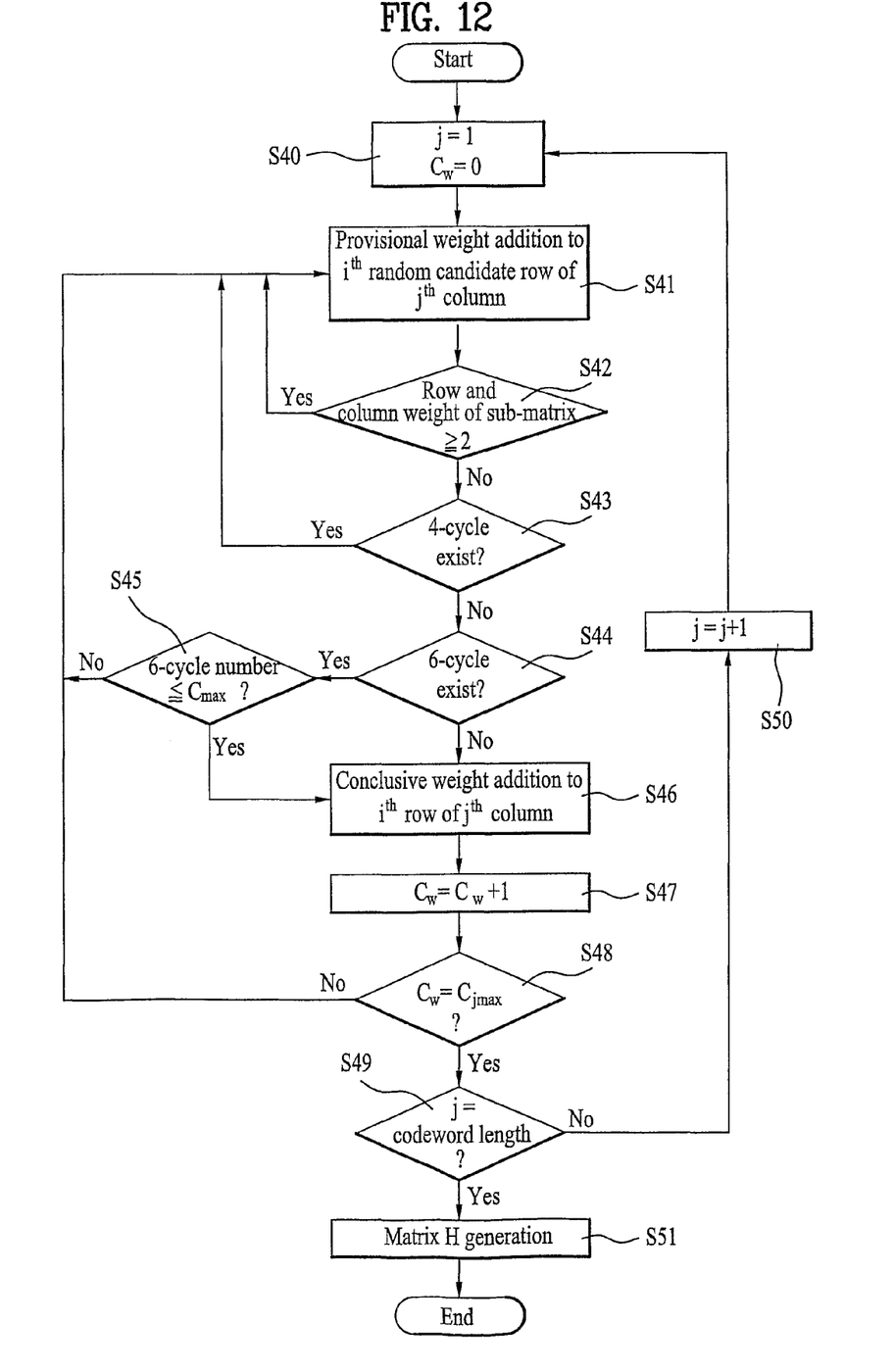
FIG. 12 is a flowchart of a further process of generating a parity check matrix H according to the present invention.

FIG. 12 is a flowchart of one process of generating a parity check matrix H according to the second embodiment (cf. FIG. 6) of the $H_d$ having the predetermined regularity in the row and column weights.

Compared to the embodiment shown in FIG. 11, the embodiment shown in FIG. 12 is further provided with a condition that the row or column weight of each sub-matrix of (n–k)/m×(n–k)/m dimensions configuring the $H_d$ should be 1. The method described in the following is just exemplary and a parity check matrix H having the aforesaid features can be generated in various ways.

Referring to FIG. 12, 'i' is an index of an arbitrary row of the parity check matrix H, 'j' is an index of an arbitrary column of the parity check matrix X, and $C_w$ indicates a current weight number of the arbitrary column j.

First of all, a weight starts being added to a first column (j=1) having no weight ($C_w$=0) (S40). In this case, the weight addition means that an element corresponding to an arbitrary row of an arbitrary column is set to '1'.

A weight is provisionally added to an arbitrary $i^{th}$ candidate row of the first column (S41). The provisional weight addition means that the weight addition to the corresponding row is not final but can be changed by a next procedure.

Subsequently, if the parity check matrix H is configured with a plurality of sub-matrices having (n–k)/m×(n–k)/m dimensions, it is checked whether a row or column having a weight equal to or greater than 2 exists in rows or columns of the sub-matrix to which an $i^{th}$ row of a $j^{th}$ column belongs (S42). If the row or column having the weight equal to or greater than 2 exists in the rows or columns of the sub-matrix to which the $i^{th}$ row of the $j^{th}$ column belongs, a weight is added not to the $i^{th}$ row but to a different row (S41) and a next procedure is executed. If the row or column having the weight equal to or greater than 2 does not exist in the rows or columns of the sub-matrix to which the $i^{th}$ row of the $j^{th}$ column belongs, it is decided whether a 4-cycle exists in the entire parity check matrix H (S43).

If the 4-cycle exists according to the decision of whether the 4-cycle exists in the entire parity check matrix H (S43), a weight is added not to the $i^{th}$ row but to another row (422) and a next procedure is then executed. If the 4-cycle does not exist, it is decided whether a 6-cycle exists in the entire parity check matrix H (S44).

As a result of deciding whether the 6-cycle exists in the entire parity check matrix H, if the 6-cycle does not exist, a weight is finally added to the $i^{th}$ row. If the 6-cycle exists, it is decided whether the 6-cycle number of the entire parity check matrix H exceeds a preset critical value $C_{max}$ (S45). If the 6-cycle number of the entire parity check matrix H does not exceed the preset critical value $C_{max}$, a weight is finally added to the $i^{th}$ row. If the 6-cycle number of the entire parity check matrix H exceeds the preset critical value $C_{max}$, a weight is added not to the $i^{th}$ row but to another row (S42) and a next procedure is then executed.

Once the weight is finally added to the $i^{th}$ row (S46), a current weight number $C_w$ of the $j^{th}$ column is incremented by 1 (S47). It is then decided whether the current weight number $C_w$ of the $j^{th}$ column is equal to a maximum weight number $C_{jmax}$ allowable to the $j^{th}$ column (S48). If the current weight number $C_w$ of the $j^{th}$ column is equal to the maximum weight number $C_{jmax}$ allowable to the $j^{th}$ column, weight addition to the $j^{th}$ column is terminated. And it is decided whether the j is equal to a codeword length (S49).

If the current weight number $C_w$ of the $j^{th}$ column is not equal to the maximum weight number $C_{jmax}$ allowable to the $j_{th}$ column, it goes back to the step S42 to provisionally add a weight to a different row of the $j^{th}$ column and to continue executing the corresponding subsequent steps.

If the j is equal to the codeword length, the weight addition to the entire parity check matrix H is terminated. Hence, according to the corresponding weight addition result, the parity check matrix H can be finally generated (S51).

If the j is not equal to the codeword length, it means that there still exists a column to which a weight is not added yet. Hence, by adding 1 to the j (S50), a weight is added to a next column from the step S22 in the above-explained manner.

As mentioned in the foregoing description, the entire parity check matrix H can be generated in the above-explained manner. Alternatively, in the parity check matrix H having the configuration of $[H_d|H_p]$, the $H_d$ is generated according to the above-explained steps and $H_p$ having a fixed form can be used. Preferably, a dual diagonal matrix of (n−k)×(n−k) dimensions is used as the $H_p$.

In FIG. 1, the receiver 30 receives to decode the data encoded in the above manner using Equation 4.

$$H \cdot c = 0 \quad \text{[Equation 4]}$$

Namely, if '0' is generated from multiplying an encoded data c by the parity check matrix H, it means that transmission error does not exist. If '0' is not generated from multiplying an encoded data c by the parity check matrix H, it means that transmission error exists. Hence, source data can be correspondingly separated.

It should be understood that the technical spirit and scope of the present invention is extendible to such a recording medium readable by a CPU (control process unit) as a CD-ROM, floppy disc, computer memory, a mobile communication terminal memory and the like. In this case, the data structure of the H or $H_d$ having the features and a program for producing the H or $H_d$ having the features are recorded in the recording medium.

INDUSTRIAL APPLICABILITY

Accordingly, the method of encoding and decoding using the LDPC code of the present invention is applicable to such a communication system as a mobile communication system, a portable Internet system, etc.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. A method of encoding input data using an LDPC (low density parity check) code, the method comprising:
   encoding the input data using a parity check matrix H having a configuration of $H=[H_d|H_p]$ where $H_d$ is (n−k)×k dimensional, $H_p$ is (n−k)×(n−k) dimensional, k is a bit number of the input data, and n is a bit number of a codeword,
   wherein if the $H_d$ comprises a plurality of sub-matrices, each of the plurality of sub-matrices has predetermined regularity in a row or column weight, and
   wherein any two random rows of the entire $H_d$ do not have 1 on at least two columns simultaneously.

2. The method of claim 1, wherein if the $H_d$ comprises m sub-matrices having (n−k)/m×k dimensions, a $j^{th}$ row of a specific sub-matrix of the m sub-matrices has $W_j$ consecutive 1's on a condition that the column weight of entire columns of the specific sub-matrix is 1.

3. The method of claim 2, wherein the $W_j$ is identical to entire rows of the specific sub-matrix.

4. The method of claim 2, wherein the $W_j$ irregularly increases or decreases for the entire rows of the specific sub-matrix.

5. The method of claim 1, wherein if the $H_d$ comprises m sub-matrices having (n−k)/m×k dimensions, the row or column weight of a random sub-matrix configuring the $H_d$ is 1.

6. The method of claim 1, wherein a number of occasions of a case that all combination-enabling two rows selected from three random rows of the entire $H_d$ have 1 at a same point is equal to or smaller than a preset critical value ($C_{max}$).

7. The method of claim 1, wherein any two random rows of the entire parity check matrix H do not have 1 on at least two rows simultaneously.

8. The method of claim 7, wherein a number of occasions of a case that all combination-enabling two rows selected from three random rows of the parity check matrix H have 1 at a same point is equal to or smaller than a preset critical value ($C_{max}$).

9. The method of claim 6, wherein the critical value ($C_{max}$) is an arbitrary value within a range of 10~100.

10. The method of claim 1, wherein the $H_p$ is a dual diagonal matrix.

11. A method of decoding input data using a parity check matrix H, the method comprising:
    decoding the input data using the parity check matrix H which has a configuration of $H=[H_d|H_p]$ where $H_d$ is (n−k)×k dimensional, $H_p$ is (n−k)×(n−k) dimensional, k is a bit number of the input data, and n is a bit number of a codeword,
    wherein if the $H_d$ comprises a plurality of sub-matrices, each of the plurality of sub-matrices has predetermined regularity in a row or column weight, and
    wherein any two random rows of the entire $H_d$ do not have 1 on at least two columns simultaneously.

12. The method of claim 11, wherein if the $H_d$ comprises m sub-matrices having (n−k)/m×k dimensions, a $j^{th}$ row of a specific sub-matrix of the m sub-matrices has $W_j$ consecutive 1's on a condition that the column weight of entire columns of the specific sub-matrix is 1.

13. The method of claim 12, wherein the $W_j$ is identical to entire rows of the specific sub-matrix.

14. The method of claim 12, wherein the $W_j$ irregularly increases or decreases for the entire rows of the specific sub-matrix.

15. The method of claim 11, wherein if the $H_d$ comprises m sub-matrices having (n−k)/m×k dimensions, the row or column weight of a random sub-matrix configuring the $H_d$ is 1.

16. The method of claim 11, wherein a number of occasions of a case that all combination-enabling two rows selected from three random rows of the entire $H_d$ have 1 at a same point is equal to or smaller than a preset critical value ($C_{max}$).

17. The method of claim 11, wherein any two random rows of the entire parity check matrix H do not have 1 on at least two rows simultaneously.

18. The method of claim 17, wherein a number of occasions of a case that all combination-enabling two rows selected from three random rows of the parity check matrix H have 1 at a same point is equal to or smaller than a preset critical value ($C_{max}$).

19. The method of claim 16, wherein the critical value ($C_{max}$) is an arbitrary value within a range of 10~100.

20. The method of claim 11, wherein the $H_p$ is a dual diagonal matrix.

* * * * *